United States Patent [19]

Gaubatz

[11] Patent Number: 5,581,208

[45] Date of Patent: Dec. 3, 1996

[54] SWITCHING ARRANGEMENT IN MOTOR VEHICLES FOR THE TIMED SWITCHING-ON OF INDUCTIVE CONSUMING DEVICES

[75] Inventor: Karl-Heinz Gaubatz, Parsdorf, Germany

[73] Assignee: Bayerische Motoren Werke Aktiengesellschaft, Germany

[21] Appl. No.: 561,149

[22] Filed: Nov. 21, 1995

Related U.S. Application Data

[63] Continuation of Ser. No. 867,111, filed as PCT/EP91/02025, Oct. 26, 1991, abandoned.

[30] Foreign Application Priority Data

Nov. 2, 1990 [DE] Germany ........................ 40 34 845.8

[51] Int. Cl.[6] .................. H03K 17/16; H03K 3/00
[52] U.S. Cl. ................... 327/379; 327/389; 327/110; 307/10.1
[58] Field of Search ................... 307/571, 572, 307/573, 270, 10.1, 10.6, 542; 361/31; 327/310, 311, 379, 380, 389, 551

[56] References Cited

U.S. PATENT DOCUMENTS

| | | | |
|---|---|---|---|
| 4,495,421 | 1/1985 | Endo et al. | 307/311 |
| 4,504,779 | 3/1985 | Haman | 323/349 |
| 4,746,813 | 5/1988 | Disser | 307/248 |
| 4,782,252 | 11/1988 | Levy et al. | 307/573 |
| 4,904,889 | 2/1990 | Chieli | 307/571 |
| 4,928,053 | 5/1990 | Sicard et al. | 307/571 |
| 5,040,088 | 8/1991 | Harrington et al. | 361/31 |
| 5,107,151 | 4/1992 | Cambier | 307/571 |
| 5,156,232 | 10/1992 | Muroya et al. | 307/10.1 |
| 5,164,613 | 11/1992 | Mumper et al. | 307/592 |
| 5,182,459 | 1/1993 | Okano et al. | 307/10.1 |

FOREIGN PATENT DOCUMENTS

| | | |
|---|---|---|
| 3139987 | 4/1983 | Germany . |
| 3720357 | 5/1989 | Germany . |
| 3835662 | 4/1990 | Germany . |
| 3843507 | 6/1990 | Germany . |
| 3908338 | 9/1990 | Germany . |

OTHER PUBLICATIONS

MOS–Module: Effektive Leistungs—Halbleiterschalter bei hohen Taktfrequenzen, pp. 74–80, Elektronik May 27, 1988.
Avoiding Spurious MOSFET turn–on, pp. 51–54, 57 Electronic Engineering, Nov. 1984.
Helmut, Betrieb von SIPMOS–Transistoren bei Masseseitiger Last. In: Siemens Components 22, 1984, H.4, S.169–170.
Wissmann, G., Lorenz, L., Ansteuerung von Leistungs-MOSFETS—Anforderungen an die Ansteuer–schaltung. In. der elektroniker, Nr. 6, 1985, S.38–45.
*The Electronics Engineer*, New Fast–Recovery Power Mosfets Improve the Efficiency in the Case of High Voltage Motor Controls, No. 5/1990.
*Electronic Components and Applications*, MOSFETS Control Motors in Automatic Applications, vol. 9, No. 2.

Primary Examiner—David C. Nelms
Assistant Examiner—Trong Phan
Attorney, Agent, or Firm—Evenson, McKeown, Edwards & Lenahan P.L.L.C.

[57] ABSTRACT

A switching arrangement in motor vehicles for the timed switching-on of inductive consuming devices by a semiconductor power switch timed by a control source has a timing element of the cut-in circuit of the semiconductor power switch that is smaller than the reaction time of the control source. This reaction time is significantly shorter than the rise time of the control voltage of the semiconductor power switch.

3 Claims, 2 Drawing Sheets

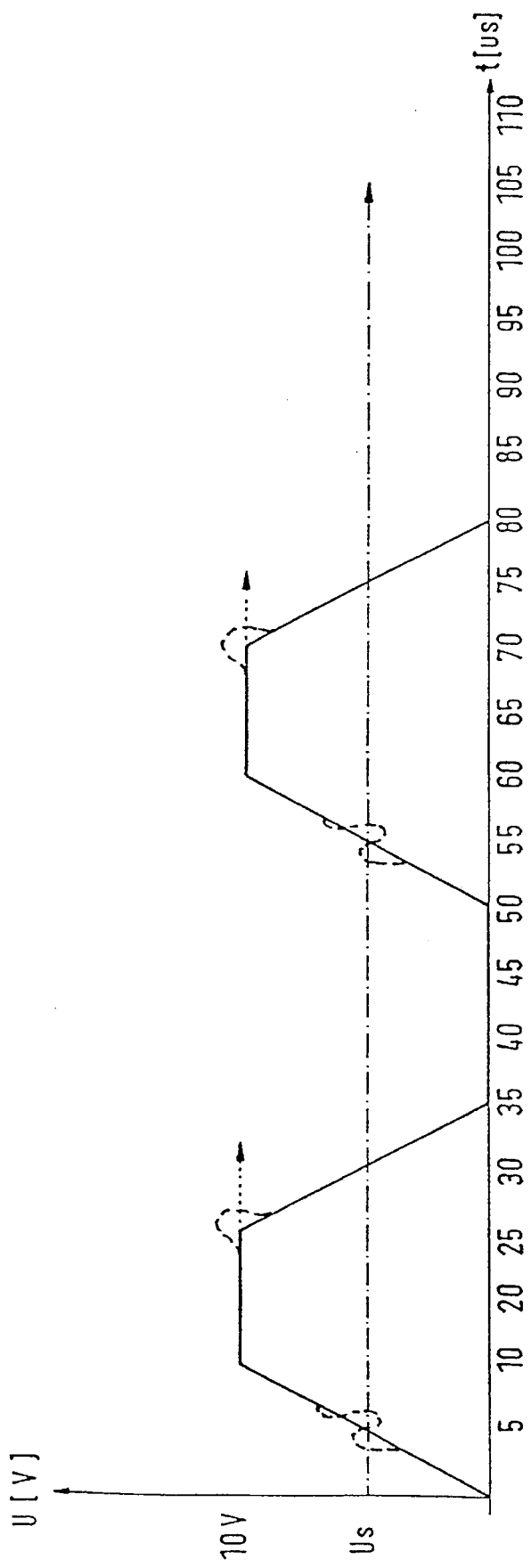

SWITCHING ARRANGEMENT IN MOTOR VEHICLES FOR THE TIMED SWITCHING-ON OF INDUCTIVE CONSUMING DEVICES

This application is a continuation of application Ser. No. 07/867,111, filed as PCT/EP91/02025, Oct. 26, 1991, now abandoned.

BACKGROUND AND SUMMARY OF THE INVENTION

The present invention relates to a switching arrangement in motor vehicles for the timed switching-on of inductive consuming devices via a semiconductor power switch timed by a control source.

A switching arrangement of the above-described type is known, for example, from the German Patent Document DE-38 35 662 A1, from the article "New Fast-Recovery Power Mosfets Improve the Efficiency in the Case of High Voltage Motor Controls" in the journal *The Electronics Engineer*, No. 5/1990, and from the article "MOSFETS Control Motors in Automatic Applications" in the Journal *Electronic Components and Applications*, Vol. 9, No. 2. Such arrangements are used for minimizing power loss or for high-frequency timing. As an example the teaching book *Current Supply Switches, Triac- and Ignition Switches* by D. Nuehrmann, 1984, page 189, generally makes known a switching arrangement for periodic switching-on of inductive consuming devices by means of semiconductor power switches, whereby the rise-time is lengthened by means of an increase of the internal resistance of the control source. This known switching arrangement, however, exhibits spurious oscillation caused by the components during the switching-through of the semiconductor power switch which negatively influence the leading edge of the switching-on signal (drain voltage) of the inductive consuming device.

When controlling inductive consuming devices in motor vehicles, such as electric motors, timing frequently takes place with high currents. In this situation, electromagnetic radiation will occur when screening measures are insufficient, in which case there may be considerable interference with electronic components. This radiation is caused by spurious oscillations when the semiconductor power switch is switched through. It also is caused by high-frequency components of the steep edges of the timing signals.

It is an object of the present invention to provide a switching arrangement of the initially described type by means of which the inductive consuming devices are timed with high currents and can be controlled free of electromagnetic radiation.

This and other objects are achieved by the present invention which provides a switching arrangement in motor vehicles for timed switching-on of inductive consuming devices. This switching arrangement includes a control source and a semiconductor power switch coupled to the control source and timed by the control source. A timing element of a cut-in circuit of the semiconductor power switch is smaller than or equal to a reaction time of the control source. The reaction time is significantly shorter than a rise time of a control voltage of the semiconductor power switch.

Each of the two time relationships predominantly counteracts one of the two above-mentioned causes of electromagnetic radiation respectively, as described in the following.

One of the problems—the component-caused spurious oscillations during the switching-through of the semiconductor power switch—is solved when the control source is switched off in such a manner that the same exhibits a reaction time with respect to the spurious oscillations, by means of which a compensation of these spurious oscillations is reached. In this case, the timing element of the cut-in circuit of the semiconductor power switch is the period of one of the spurious oscillations which occur at the switching-through moment of the semiconductor power switch from the charge reversal operations in the parasitic capacitances of the semiconductor power switch in interaction with the internal resistance of the control source. The smaller the internal resistance of the control source, the shorter the timing element of the cut-in circuit of the semiconductor switch. The reaction time of the control source is the shortest time within which the control source can compensate the spurious oscillations so that a linearly rising voltage is achieved at the output of the control source which is identical with the control voltage of the semiconductor power switch.

The second problem—the electromagnetic radiation by high-frequency parts of a timing signal with steep edges—is solved when the edges are flattened by means of an increase of the rise time until the radiation is minimized corresponding to the motor vehicle regulations. In this case, the rise time is the time within which the control source increases the control voltage of the semiconductor power switch uniformly from the minimal to the maximal level. The rise time is a multiple of the reaction time of the control source.

Accordingly, as a result of the time relationships corresponding to the invention, electromagnetic radiation is prevented from arising so that no cost-intensive measures must be taken in order to suppress it.

In an embodiment of the invention, the semiconductor power switch is a field effect transistor and the control source includes a power operational amplifier.

The use of a field effect transistor as the semiconductor power switch shortens the timing element of the cut-in circuit because of the fact that field effect transistors have no retention time and can be switched faster than, for example, bipolar transistors. By the use of a power operational amplifier in the control source, a very short reaction time is achieved in a simple manner. At the same time, the minimal low impedance of the internal resistance of a power operational amplifier provides the adjustment of the ratio according to the invention of the timing element of the cut-in circuit to the reaction time.

Other objects, advantages and novel features of the present invention will become apparent from the following detailed description of the invention when considered in conjunction with the accompanying drawings.

BRIEF DESCRIPTION OF THE DRAWINGS

FIG. 2 is a view of the time sequence of the control voltage of the field effect transistor when the switching arrangement according to the invention is used.

DETAILED DESCRIPTION OF THE DRAWINGS

Figure 1:
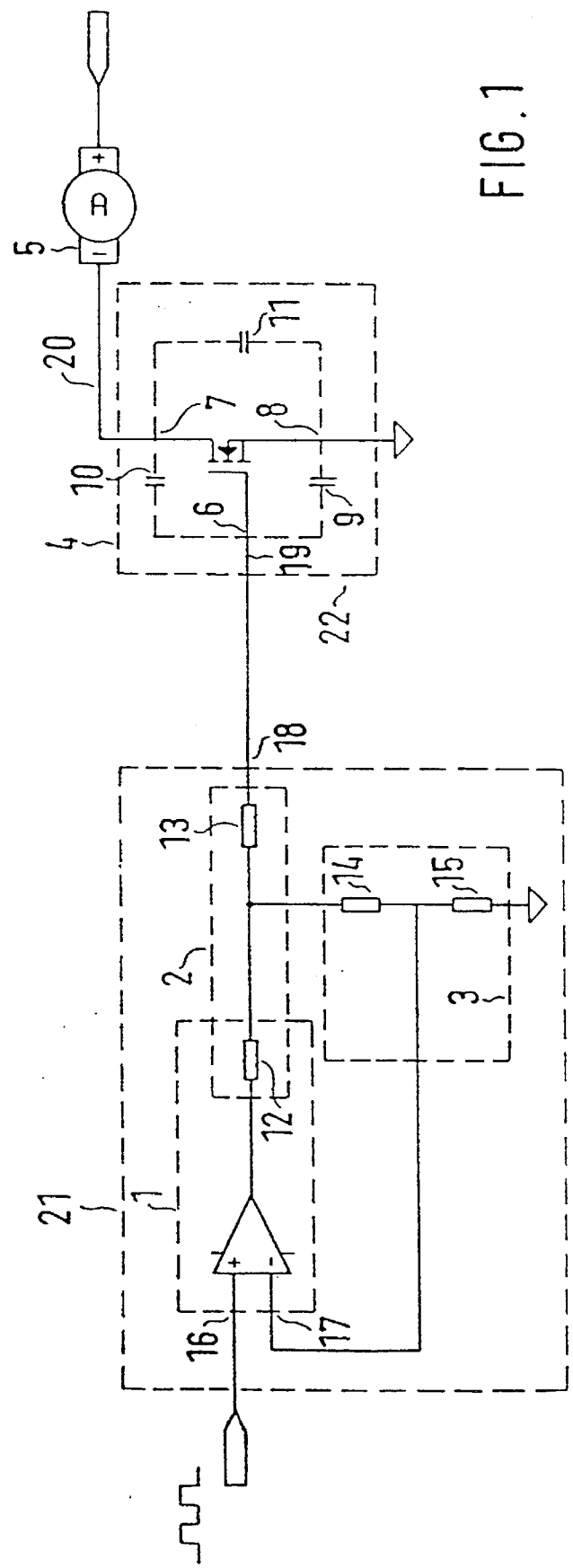
FIG. 1 is a schematic view of the switching arrangement for the timed switching of an inductive consuming device constructed in accordance with an embodiment of the present invention.

In FIG. 1, an inductance 5 to be timed, such as an electric motor for a heater fan, is connected to the drain contact 7 of a field effect transistor 4. The field effect transistor 4 is a self-locking n-channel metal-oxide semiconductor field effect transistor. The parasitic capacitances 10, 9 and 11 of the field effect transistor 4 are disposed between gate 6 and drain 7, gate 6 and source 8 as well as source 8 and drain 7. Together, capacitances 10, 9 and 11 form the overall capacitance 22 of the field effect transistor 4.

The control voltage 19 of the field effect transistor 4 is fed between gate 6 and source 8. The control voltage 19 is at the same time the output voltage 18 of the control source 21. The control source 21 comprises a power operational amplifier 1 with its internal resistance 12, a protective resistance 13 which is connected in series with the internal resistance 12 and with the gate 6 of the field effect transistor 4, and a voltage divider 3. The voltage divider 3 comprise two resistances 14 and 15 and is connected with the protective resistance 13 and the interior resistance 12 of the power operational amplifier 1. A portion of the output voltage 18 of the power operational amplifier 1 is fed back via the voltage divider 3 between resistances 14 and 15 to the negative input 17 of the power operational amplifier 1.

For the control of the inductance 5, a timing signal, for example, with a frequency of 20 kHz, is fed to the positive input 16 of the power operational amplifier 1.

The control source 21 amplifies the level of this timing signal, for example, from 1 V to 10 V and thus switches the field effect transistor 4. The drain current 20 of the field effect transistor 4, in turn, activates the inductance 5 with the frequency set by the timing signal.

Electromagnetic radiation is created in the case of spurious fluctuations of the drain current 20 which may assume current values of about 30 A. These spurious fluctuations of the drain current 20 are a direct function of spurious oscillations of the control voltage 19 of the field effect transistor 4 at the switching-through threshold.

The spurious oscillations of the control voltage 19, in turn, result from charge reversal operations in the parasitic capacitances 9, 10 and 11 of the field effect transistor 4 in connection with the overall internal resistance 2 of the control source 21, the overall internal resistance 2 being the result of the series connection of the internal resistance 12 and of the protective resistance 13.

The time constant is obtained from the multiplication of the overall capacitance 22 of the parasitic capacitances 9, 10 and 11 with the overall internal resistance 2 of the control source 21. The lower the impedance of the overall internal resistance 2 the shorter the time constant.

The reaction time of the control source 21 is determined by the selection of the power operational amplifier 1. The output of the power operational amplifier 1 is connected back in the sense of a reverse feedback via the voltage divider 3 to the inverted input. The control source 21 by way of this reverse feedback acts as current controlled voltage source, as for example disclosed in the teaching book Semiconductor Switching Technology (especially page 129 and page 350), Tietze/Schenk, 1986 Edition. Thus the reaction time of the control source 21 amounts to the control time during which the spurious oscillations are compensated or settled.

The present invention can be demonstrated mathematically by means of a numerical example: A field effect transistor 4 is used with an overall capacitance 22 of 1,500 pF.

The overall resistance 2 of the control source 21 comprises the preset internal resistance 12 of the power operational amplifier 1 with 17 ohms and the protective resistance 13 dimensioned at 33 ohms to amount to a total of 50 ohms.

This results in a time constant of 1,500 pF * 50 ohms=75 ns. The period of a spurious oscillation is approximately 5 * 75 ns=375 ns.

On the other hand, electromagnetic radiation is also caused by high-frequency portions of a timing signal. For this purpose, the power operational amplifier 1 amplifies the input level by a factor 10—in this case, therefore, from 1 V to 10 V, and, because of its slew rate of 1 V/1 µs, causes a rise time of the control voltage 19 to a maximal value of 10 µs. As a result of the ratio of the rise time (10 µs) to the period of the timing signal (1/20 kHz=50 µs) of approximately 1:5, the power operational amplifier 1 prevents electromagnetic radiation particularly effectively by means of this dimensioning.

FIG. 2 illustrates by means of the values of the numerical example the time sequence of the control voltage 19 of the field effect transistor 4 generated by the switching arrangement according to the invention. The timing signal exhibits a flat and smooth rise of the control voltage 19. Without the switching arrangement according to the invention, the spurious oscillations in the rising edge, drawn by the interrupted line in FIG. 2, would occur at the switching-through threshold. When a field effect transistor is used, it is also possible that overshooting occurs when the control voltage 19 is switched off, as indicated by the interrupted line on the falling edge. However, this disturbance may be suppressed by external wiring, for example, by a high pass, which, however, is not the object of the present invention.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. Switching arrangement for periodic switching-on of inductive consuming devices in a motor vehicle, comprising:

a semiconductor power switch for providing electric current to said inductive consuming devices;

a control source for periodically switching said semiconductor power switch between off and on states, wherein said control source exhibits a reaction time in switching of said semiconductor power switch, and a control voltage applied to said semiconductor power switch by said control source is characterized by a rise time, said rise time of the control voltage being a multiple of the reaction time of the control source, whereby spurious oscillations during switching of said semiconductor power switch are compensated.

2. Switching arrangement according to claim 1, wherein said control source comprises a low total internal impedance and a negative feedback arrangement.

3. Switching arrangement according to claim 2, wherein the rise time of the control voltage is determined by a slew rate of the control source.

* * * * *